(12) United States Patent
Laor

(10) Patent No.: US 6,516,121 B2
(45) Date of Patent: Feb. 4, 2003

(54) CONFIGURING OPTICAL FIBERS IN A MULTI-CHIP MODULE

(75) Inventor: Herzel Laor, Boulder, CO (US)

(73) Assignee: Interconnect Technology LLC, Boulder, CO (US)

( * ) Notice: Subject to any disclaimer, the term of this patent is extended or adjusted under 35 U.S.C. 154(b) by 11 days.

(21) Appl. No.: 09/843,136

(22) Filed: Apr. 26, 2001

(65) Prior Publication Data

US 2002/0009270 A1 Jan. 24, 2002

Related U.S. Application Data

(60) Provisional application No. 60/199,713, filed on Apr. 26, 2000.

(51) Int. Cl.⁷ .............................. G02B 6/30; G02B 6/36
(52) U.S. Cl. ........................ 385/49; 264/1.25; 29/846
(58) Field of Search .............................. 385/49, 50, 51, 385/80, 88–94, 14, 83, 33, 130, 147, 76; 264/1.25, 1.29, 1.7; 427/163.2; 174/259, 60, 158; 29/846, 850

(56) References Cited

U.S. PATENT DOCUMENTS

| | | | |
|---|---|---|---|
| 3,860,405 A | | 1/1975 | Coucoulas et al. |
| 3,872,236 A | | 3/1975 | Swengel, Sr. et al. ..... 174/68.5 |
| 4,005,312 A | | 1/1977 | Lemelson ................... 250/551 |
| 4,602,318 A | | 7/1986 | Lassen ........................ 361/414 |
| 5,073,000 A | | 12/1991 | Derfiny ........................ 385/14 |
| 5,155,785 A | | 10/1992 | Holland et al. ............... 385/89 |
| 5,259,051 A | | 11/1993 | Burack et al. ................ 385/76 |
| 5,301,251 A | | 4/1994 | Moore et al. ................. 385/91 |
| 5,317,657 A | | 5/1994 | Gallo et al. .................. 385/14 |
| 5,345,529 A | | 9/1994 | Sizer, II et al. ............. 385/147 |
| 5,887,089 A | * | 3/1999 | Decon et al. ................. 385/10 |
| 5,898,806 A | | 4/1999 | Nishimoto .................... 385/49 |
| 5,955,010 A | | 9/1999 | Okada et al. .............. 264/1.25 |
| 6,039,701 A | * | 3/2000 | Sliwa et al. ................ 600/588 |
| 6,174,092 B1 | | 1/2001 | Siala ............................ 385/91 |
| 6,343,171 B1 | * | 1/2002 | Yoshimura et al. ........... 385/14 |
| 2002/0009270 A1 | * | 1/2002 | Laor ............................ 385/95 |
| 2002/0039464 A1 | * | 4/2002 | Yoshimira et al. ............. 385/14 |
| 2002/0049389 A1 | * | 4/2002 | Abreu ......................... 600/558 |
| 2002/0051766 A1 | * | 5/2002 | Smith et al. ............... 424/93.7 |
| 2002/0097962 A1 | * | 7/2002 | Yoshimura et al. ........... 385/50 |
| 2002/0110328 A1 | * | 8/2002 | Bischel et al. ................ 385/49 |

OTHER PUBLICATIONS

Pescovitz, David, "Wired for Speed," *Scientific American*, May, 2000, pp. 41–42.

* cited by examiner

Primary Examiner—Akm E. Ullah
(74) Attorney, Agent, or Firm—Kilpatrick Stockton LLP

(57) ABSTRACT

The present invention is directed to a methodology, structure and process (200) for routing connecting, and forming optical fibers between optical ports such as optical transmitters and receivers/detectors to create optical pathways for signal transfer therebetween. More particularly, when connecting timed optoelectronic chips on a Multi Chip Module, an optical fiber is aligned above an optical port (202), the fiber and the port surface are heated (204), (206) and contacted (208) creating an adhesion bond therebetween. The fiber is then routed (210) to another optical port for connection (214). The fiber may then be connected to additional ports (218) or severed (220). Once severed, the optical pathway may be adjusted to synchronize timing between optoelectronic chips. If a chip's timing is advanced or delayed, the connecting optical pathway may be lengthened (224) or shortened (226). Last, the optical fibers are annealed (228) to relieve internal stresses and cure surface defects.

13 Claims, 14 Drawing Sheets

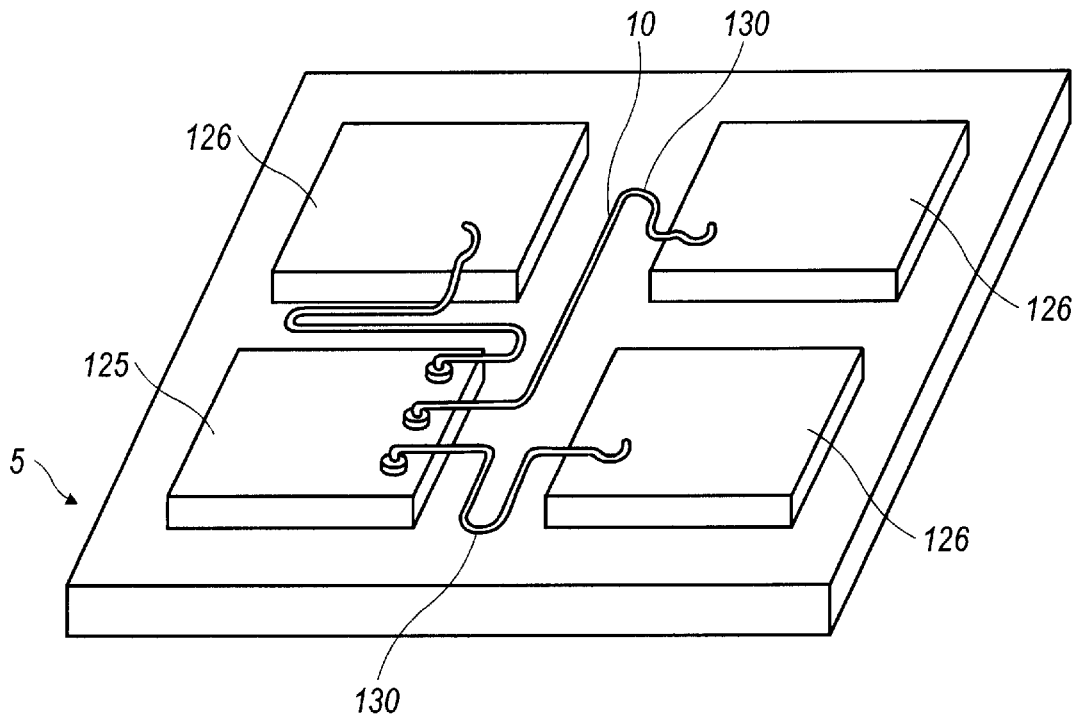
FIG. 14
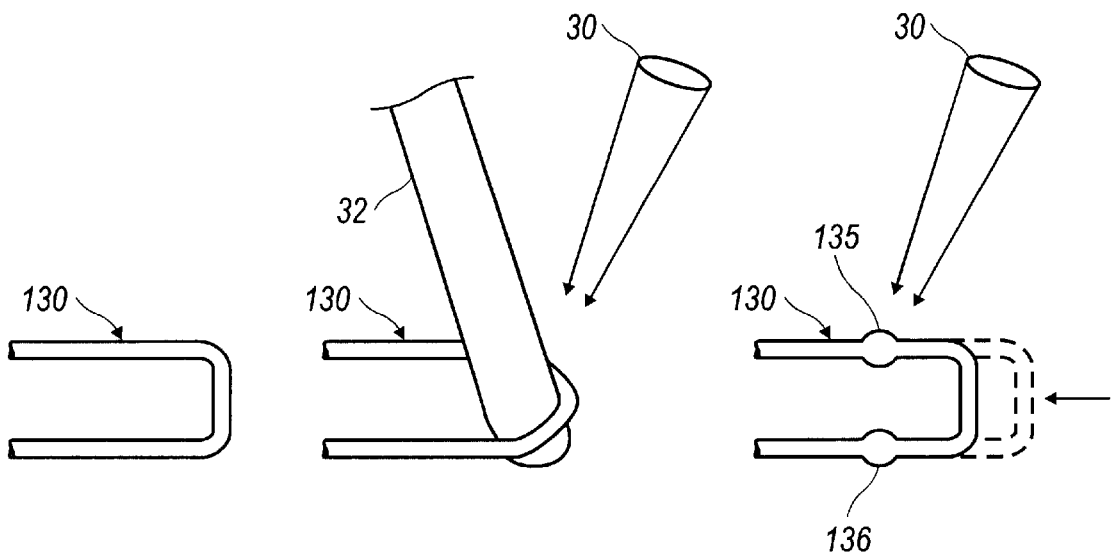
FIG. 15A  FIG. 15B  FIG. 15C

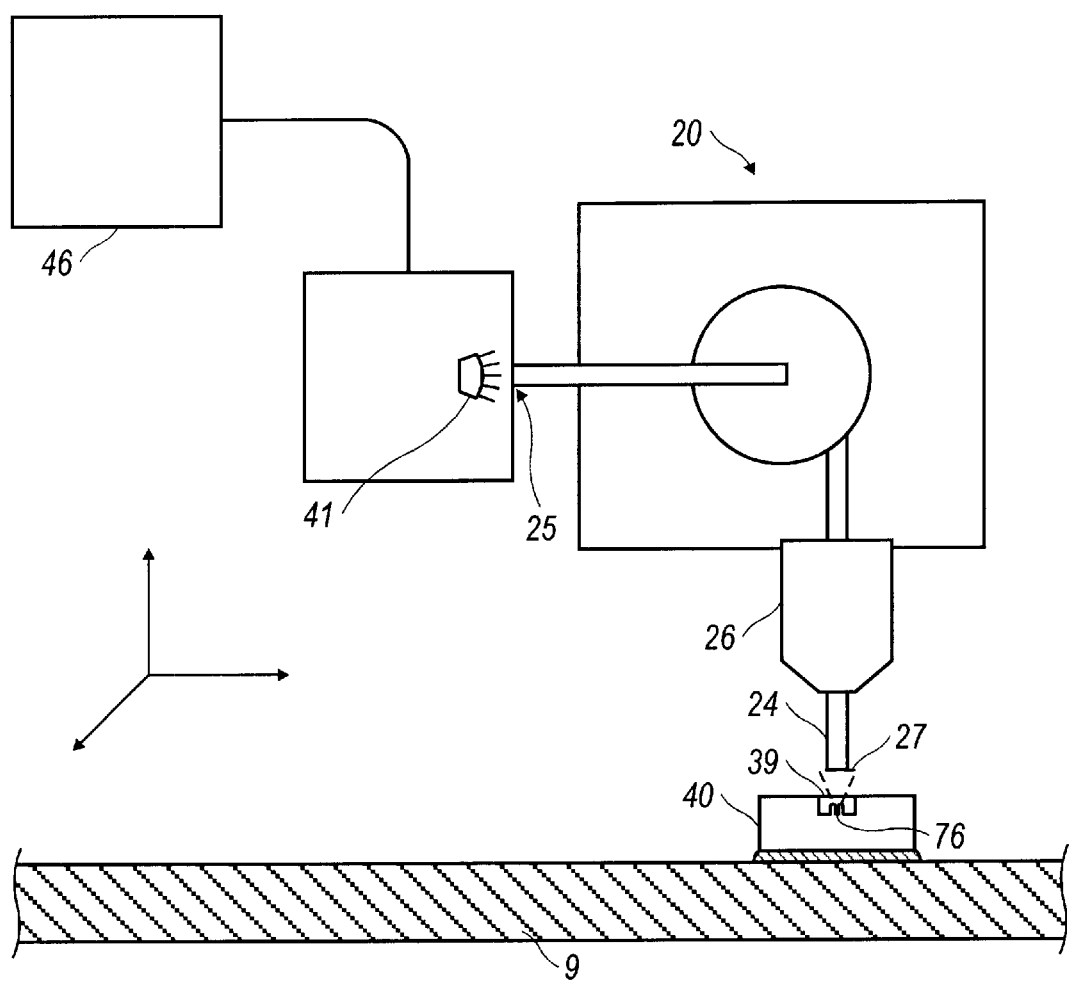
FIG. 16
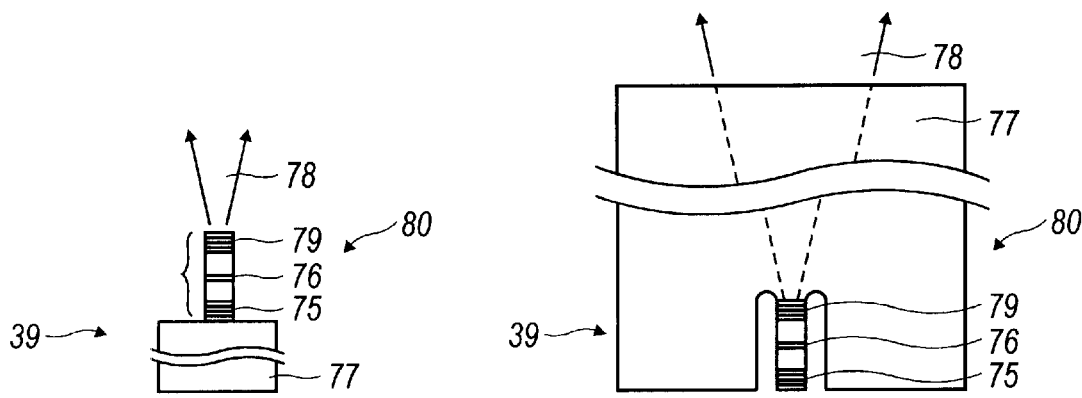
FIG. 17A  FIG. 17B

CONFIGURING OPTICAL FIBERS IN A MULTI-CHIP MODULE

CROSS-REFERENCE TO RELATED APPLICATIONS

This application claims priority to U.S. Provisional Application Ser. No. 60/199,713, filed Apr. 26, 2000, entitled "Optical Fiber Interconnect in Multi Chip Module."

FIELD OF THE INVENTION

The present invention relates to routing, forming and connecting (collectively, "configuring") optical fibers between optical ports such as optical transmitters, receivers/detectors and additional fibers, and more particularly, to configuring optical fibers between optical ports where connection distances are short thus requiring small radius bends in the routing of connection fibers. The present invention further relates to optoelectronic devices involving such optical fiber configurations and apparatus for manufacturing such optoelectronic devices.

BACKGROUND OF THE INVENTION

Optical fiber communication is an important mode of data transmission around the world due in part to large bandwidth capabilities and freedom from most forms of electromagnetic interference. Additionally, as computer speeds approach one gigahertz (GHz) and beyond, parasitic Resistance, Capacitance and Inductance (RCL) of connecting wires adversely influence data transmission, making direct optical connections more desirable to, between, and within computers and other communication devices. Particularly desirable is the optical connection of all timed devices within a computing device to deliver clock distributions between chips/components in phase or otherwise with a known temporal relationship. In addition, it is not unusual for different timed modules in a device to require different voltages. In conventional wiring arrangements, timing and data transmissions must first be converted to the proper voltage before being relayed from one module to the next. This, along with the RCL problems associated with high speed transfers can cause significant delays of synchronized signals and thus, adversely affect system performance. Optical connections can reduce or eliminate these problems. However, connecting and routing optical fibers between optical ports presents an array of additional problems. These problems include: shear stress at the connection point, difficulty routing due to fiber stiffness, optical distortion caused by adhesives, light leakage from sharp bends, micro fractures, sharp fibers damaging components etc.

There have been numerous attempts to overcome the difficulties in connecting optical ports. One method entails a non-contact alignment of a connecting fiber and the corresponding optical port such that the signal propagates through space. While this method solves several problems, such as shear stress at the connection point, it causes others. For example, components typically must be precisely mounted, directed, and aligned within 'eyesight' of the optical ports, e.g., in a pathway of the transmitted optical beam, within the acceptance angle of an optical fiber end, or in optical alignment with a detector surface of an optoelectric transducer. Other attempts have used optical adhesives to 'glue' optical fibers to optical ports, however, such methods have proven difficult in mass production and often the adhesive has an impact on optical performance.

Another approach involves extruded optic transmission lines between optical transmission ports. This eliminates certain inherent problems with connecting ports with optical fibers. Since the optical pathways are formed in place, they reduce or avoid internal stresses and micro fractures that result from bending an existing optical fiber. Additionally, the extruded optical pathways are easily routed since they are formed in place in a fluid state. However, in order to obtain a good surface adhesion bond between he extruded pathways and the optical port, the temperature of the optical port must generally be elevated to ensure proper bonding. Additionally, if the extruded pathway cools too quickly, clogging can occur at the nozzle of the extruder head. These problems may be addressed by performing these extrusions at an elevated ambient temperature, e.g., between 170° and 250° Celsius. These elevated temperatures may be problematic in certain contexts involving sensitive components. Finally, such extruded optical pathways generally only address a single connection, from one optical port to a second port, and do not provide a method for forming a series of connections using a continuous optical guide.

SUMMARY OF THE INVENTION

This invention addresses problems outlined above providing the desired result of accurately connecting optical ports with an optical fiber in a simple efficient manner and without unduly degrading the fiber or its optical transmission qualities. The invention provides a simple process and associated structure for forming optical connections without intervening adhesives or free space pathways and with minimum heating of the ambient environment. Additionally, the invention allows connecting fibers to be simply lengthened and shortened and annealed in place. Processes and apparatus for fiber alignment and forming multiple connections with a single fiber are also described, as well as the resulting optoelectronic devices.

As used herein, optical ports include active optical transmission elements (such as, electronic chips with light emitters, including but not limited to LEDs, Lasers, or VCSELs (Vertical Cavity Surface Emitting Laser)) active optical receiving elements such as photodiodes and other detectors or photoelectric transducers) and passive transmission/detection elements (such as ends of optical fibers which, in turn, may be associated with active elements). Optical fibers include homogenous single strands and fibers including a core and cladding like modem telecommunication fibers. Preferably, the fiber will contain a core and cladding to improve its optical characteristics. The optical fibers may be made of various materials including quartz, glass or plastic.

According to one aspect of the present intention, a method and corresponding apparatus are provided for connecting an optical fiber between optical ports. The method involves heating an end portion of an optical fiber to soften the end portion, contacting the softened end portion to a first optical port, routing the optical fiber to a second port and connecting the fiber to the second port. In addition, to increase adhesion, the top surface of the optical port or associated structure may also be heated. Preferably, all heating is done using a localized heating process, (e.g. laser or ultrasound heating such that the potential for heat damage to nearby components is reduced. Once softened, the end may be contacted with the port to create an optical coupling. Feedback based on an optical signal transmitted through the fiber may be used for accurate fiber/port alignment as described in more detail below. The fiber is preferably a preformed fiber, accordingly, the step of routing may involve unspooling a length of fiber as well as forming, dimensioning and annealing the fiber by heating as discussed below. The fiber may be optically connected to the second port, for example, by physically terminating the fiber at the second port or by bending and bonding the fiber's longitudinal edge at the second port. In either case, the fiber may be bonded at the second port by a heating, softening, and contacting process.

As will be appreciated, the inventive optical connection method will work with multiple fiber types including fibers made of glass, plastic or quartz. More particularly, the method can utilize homogenous fibers as well as optical fibers that containing a homogenous core surrounded by a different refractive index light reflecting cladding.

With respect to the optical ports, at least two ports may be connected using an optical fiber for signal transfer therebetween. The connection generally will involve connecting at least one light emitting port with at least one light detecting port. However, connections can also be made between active components (emitters and receivers) and passive or intermediate components such as the end of a telecommunications fiber-optic cable and/or wave guides. As will be appreciated, connection to an intermediate component such as a telecommunication fiber allows the direct connection of an electronic chip to an optical network, especially in contexts where it may be impractical to directly connect the telecommunications fiber to the chip. Additionally, multiple optical ports contained within a computer on optoelectronic chips may be interconnected using the above method. For example, a clock chip within a computer containing multiple optical ports may be connected to numerous time dependent components using multiple fibers. Alternatively, multiple ports may be connected using a single optical fiber creating chain-link connections therebetween as will be further described below. Finally, many fibers may be connected in parallel between optoelectronic chips creating bus connections.

With respect to connecting the fiber to the second port, the fiber may be softened and pressed into contact with the optical port. This may be done using a mechanical pawl that holds the fiber on the port either immediately after or while the localized heating is performed. Again this heating will preferably be done with a focused source such as a laser. Preferably, the pawl is made of a transparent material such that the laser can heat the fiber while the pawl remains in place. As will be appreciated, by using a localized source, not only can the fiber be heated, but the port itself may also be heated to increase the adhesion bond between the port and fiber. Generally, the pawl presses in a direction transverse to the longitudinal axis of the connection fiber to force the fiber into contact with the structure of the second port; this in effect 'bends' the connection fiber at the connection point. This bend creates a narrowing or 'neck' in the fiber's cross-section, thus, increasing the angle at which photons within the fiber hit the core/clad interface. Normally, the fiber cladding reflects the photons back into the fiber, however, if the angle at which the photons hit the optical fiber cladding is great enough, light will leak out of the core pass though the cladding and thereby form a connection with the optical port. If the neck angle is great enough, nearly all the photons will exit the fiber, however, if the neck angle is reduced, fewer photons will exit the fiber and the remainder can continue down the fiber. As will be appreciated, this method works with homogenous fibers as well as core and cladding optical fibers.

By utilizing a bending connection with a shallow angle, where some photons continue being refracted within the fiber, multiple optical ports can be connected using a single optical fiber. For example, a light emitting port may be connected to three light detecting ports, where the middle two detecting ports utilize a neck connection as discussed above allowing the light emitting port to be coupled with all light detecting three ports. As will be appreciated, this creates a chain-link connection between the ports and several such fibers connected in parallel may be used to create a bus connection. The above example envisions a simple chain-link or bus connection, however, much more complicated connections are possible within the scope of this invention. According to another aspect of the present invention, an optoelectronic device includes a side-mounted fiber/port interface. Specifically, the device includes an optical fiber and port for transmitting and/or receiving optical signals relative to the optical fiber. The fiber includes a longitudinal axis, along which optical signals propagate, and a side wall defined by the circumference of a cross-section transverse to the longitudinal axis. In accordance with the invention, a connection is formed between the port and a portion of the fiber side wall so that light is transmitted between the port and the fiber through the side wall. The port may be an active port or a passive port.

In one embodiment, the port is a receiver or detector. Light transmitted through the fiber is caused to penetrate the side wall at the location of the port to form an optical connection. The fiber may be of homogenous construction or non-homogenous (e.g., core and cladding) construction. In the latter case, light may also penetrate the cladding to effect the connection. Light may be caused to penetrate the side wall by bending or forming a neck in the fiber so that light is incident on the side wall or core/cladding interface at an angle greater than a critical angle for retaining the light in the fiber which may be related to the fiber's acceptance angle. The connection may be formed so that some light exits the fiber at the port to form the connection and other light is retained within the fiber and is available for forming serial connections using a single fiber.

According to another aspect of the present invention, a method and corresponding apparatus are provided for routing an existing optical fiber between optical ports without unduly degrading the fiber's optical transmission qualities. The inventive method includes applying heat to soften the optical fiber as it is routed from one connection point to the next to prevent fracturing the stiff fiber. Preferably, the heating is a localized process, such that the potential for heat damage to nearby components is reduced. A localized heat source as described above may be used to soften the fiber route the fiber. Additionally, to prevent fiber degradation, the method preferably involves retracing and heating the entire length of the optical pathway after connection. As may be appreciated, this post connection softening of the fiber relieves internal stresses of the connected fiber. This softening in turn eliminates shear forces located at the connection between the optical ports and the optical fiber. Last, the post connection softening seals microfractures in the optical connection fiber's surface preventing undue light leakage and premature breakage.

According to another aspect of the invention, a method is provided for active alignment of the optical fibers with their respective optical ports. In certain cases, optical ports on optoelectronic chips are not easily located by sight or alignment marks or are otherwise susceptible to optical losses due to misalignment. For example, a common practice involves mounting chips upside down on a ball and solder grid and emitting or receiving optical signals through the chip's substrate. Generally, chips do not contain alignment marks on their substrate making visual location and alignment more difficult. The active alignment method involves disposing a first end of a connecting fiber proximate to the optical port, transmitting an optical signal through the fiber relative to the port, monitoring the signal, and adjusting the position of the connection fiber to maximize the signal transfer. More particularly, one end of the connection fiber may be optically connected to an optical component capable of sending and/or receiving optical signals. The other end is brought into proximity with the optical port. Then, in the case of an emitting port, the connection port is driven to produce a light output. The light output signal is monitored through the attachment fiber. Once the signal is maximized, the above described attachment method or another attachment method is performed. Alternatively, a signal may be transmitted through the fiber to the port, e.g., in the case of a light receiving or passive port to perform the active alignment. In this regard, an output of the port may be monitored to identify a maximum value of the received signal to thereby optimize alignment.

According to a further aspect of the invention, a method is provided to adjust the optical pathway length after connection. As will be appreciated, this is particularly desirable in connecting multiple timed modules to a clock chip, wherein variance in the length of the optical pathways can affect synchronization. The method involves heating a section of the connected optical pathway, causing or allowing a force to act upon the fiber, and adjusting the length of the fiber. More particularly, when increasing length, a section may be heated to a near molten state after which a mechanical force is applied to stretch the fiber. When decreasing the length, the applied force may be the surface tension of the molten fiber, which draws the fiber shorter. As will be appreciated, multiple adjustments may be made on a single fiber if needed.

BRIEF DESCRIPTION OF THE DRAWINGS

For a more complete understanding of the present invention and further advantages thereof, reference is made to the following detailed description, taken in conjunction with the drawings, in which:

FIG. 14 is a perspective view of a Multi Chip Module (MCM) containing a master clock chip connected to multiple timed chips with optical pathways of equal distance in accordance with the present invention.

FIGS. 15A–15C illustrate lengthening an optical trombone and shortening an optical trombone in accordance with the present invention.

FIG. 16 shows a fiber connecting apparatus configured to monitor light emitted from an optoelectronic port in accordance with the present invention.

FIGS. 17A and 17B show side views of an optoelectronic emitting VCSEL chip.

DETAILED DESCRIPTION

Certain preferred embodiments of the present invention will be explained in detail by referring to the accompanying drawings. Although the illustrated embodiments of the invention are shown in conjunction with specific multichip module (MCM) structures interconnected with fiber optic connections, various aspects of the invention described below are applicable in other contexts.

Figure 1:
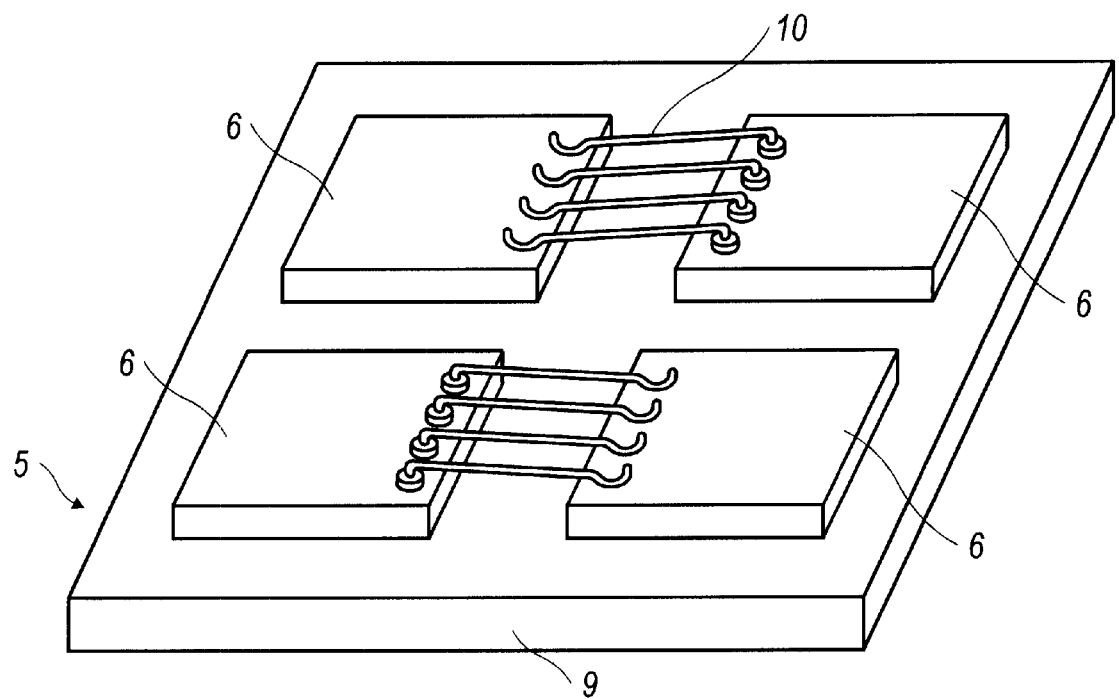
FIG. 1 is a perspective view of a Multi Chip Module (MCM) in accordance with the present invention.
Figure 2A:
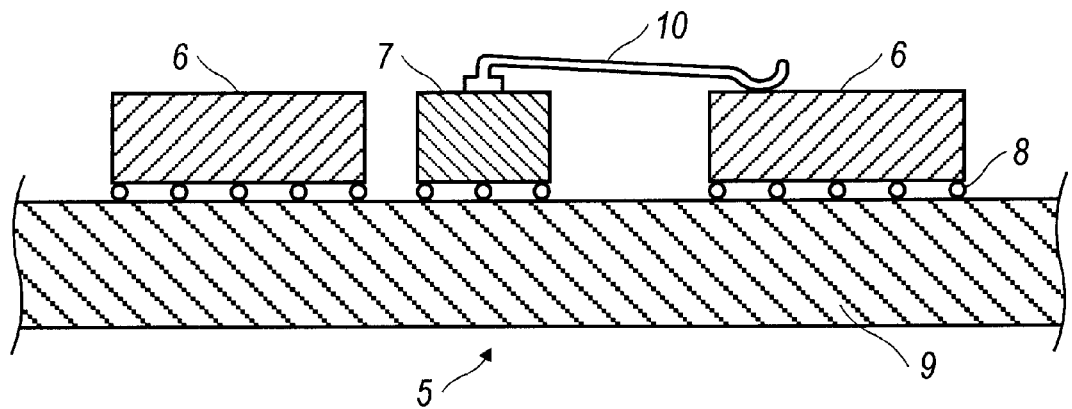
FIGS. 2A and 2B are side views of an MCMs showing optical fiber connections between optoelectronic chips in accordance with the present invention.
Figure 2B:
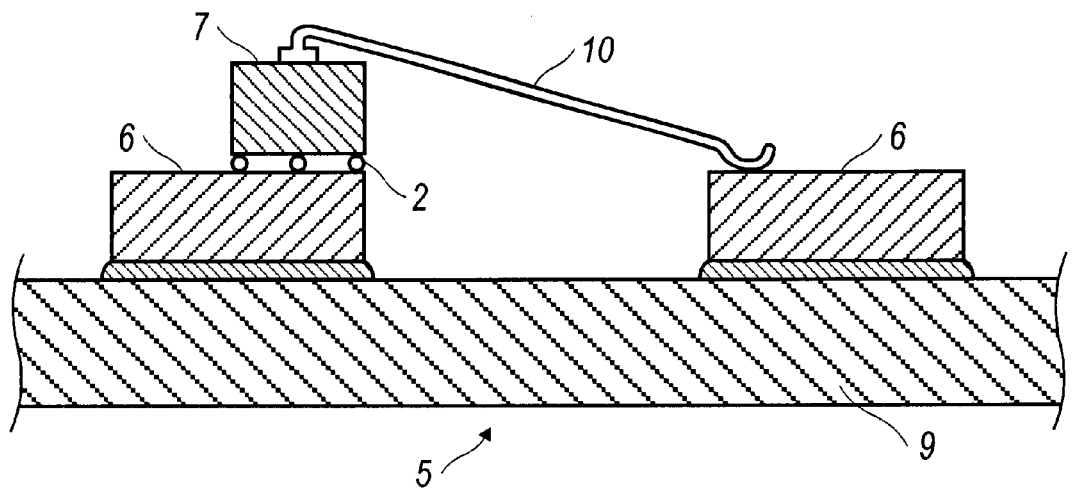

FIGS. 1, 2A and 2B, in which similar components are identified by the same numerals, show various implementations of a multichip module (MCM) 5. The MCM 5 generally includes a number of optoelectronic chips 6 mounted on a carrier 9. The MCM 5 includes at a minimum of two chips and up to several tens of chips or more. The optoelectronic chips 6 contained on the MCM 5 may be comprised of any type of electrical componentry such as CPUs, memory chips, timing chips, etc. In accordance with the present invention, the chips 6 contain either a light (radiation) emitter, such as an LED, a laser, or a VCEL or a light-detecting element such as a photodiode, CCD detector or the like. Generally, the light emitters or light detectors convert electrical energy to optical energy or optical energy to electrical energy. Additionally, a single chip may contain either or both optical emitters and detectors.

Referring to FIGS. 2A–2B, in certain cases a separate optoelectronic chip 7 is used for light generation. For example, many chips are made from silicon, whereas sources typically are fabricated using a variety of other materials. In the illustrated embodiments, the separate optoelectronic chip 7, which includes a light emitter, is electrically coupled to the chips 6. As shown in FIGS. 2A and 2B, a light source chip 7 made of, for example, GaAs is connected to silicon based chips 6. In FIG. 2A, chips and optoelectronic source chip 7 are mounted on ball and grid arrays 8 on the chip carrier 9. Chips 6 and optoelectronic source chip 7 are electrically connected by circuitry not shown in the carrier 9. In FIG. 2B, source chip 7 is directly mounted on one of chips 6 using a ball and grid array 2. The optoelectronic chips 6 and 7 of FIGS. 1–2B may be mounted on any suitable carrier 9 such as, for example, an integrated circuit board, a ceramic chip carrier etc.

To allow communication between various ones of the optoelectronic chips 6 and 7 of FIGS. 1–2B, they are interconnected via optical pathways to allow for the transfer of signals (transmitted as photons) therebetween. In the illustrated embodiment, each pathway is created using an existing optical fiber 10. This fiber 10 may be made of glass, quartz or plastic and may be homogenous in cross-section or may contain a core and cladding like a typical single mode or multimode telecommunications fiber. Preferably, cladded fibers are used since the clad provides near total internal reflection of the light within the core reducing light leakage and improving signal transfer. However, when using homogenous fibers, a white or transparent (with a lower refractive index than the fiber) coating may be applied to aid in light refraction.

Figure 3:
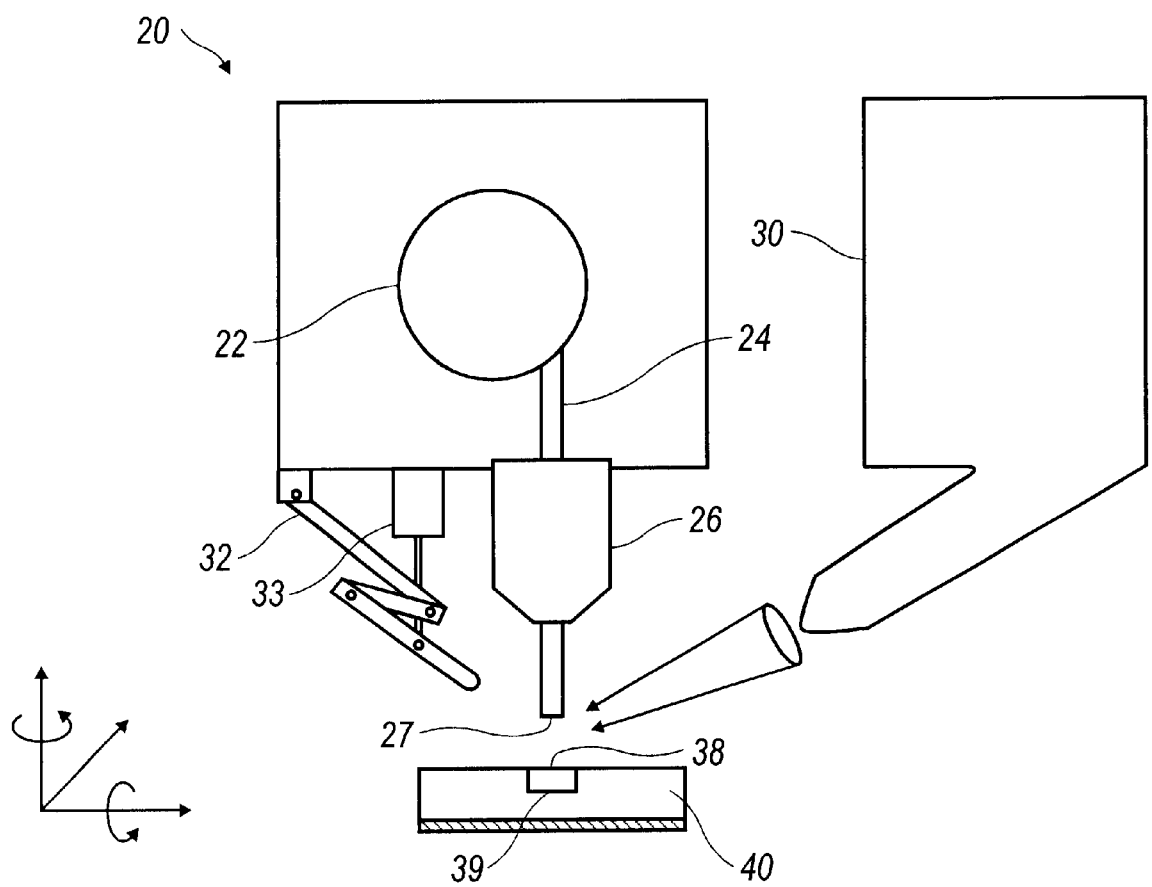
FIG. 3 is a plan view of an apparatus for making optical connections in accordance with the present invention.

In the embodiments discussed above, the fiber 10 connects an optical emitter formed on one of the chips to an optical detector of another one of the chips. As will be discussed below, fiber may also be used to couple an emitter or detector of one chip to a component other than an emitter or detector e.g., another fiber. Such emitters, detectors and other components for optical coupling are collectively and separately referred to hereafter as optical ports. As shown in FIG. 3, a routing head 20 may be used to form the optical connections. The routing head 20 is preferably able to freely move in three dimensions to make optical connections on the electronic chips and route fibers therebetween. Additionally, the routing head 20 can rotate about vertical and horizontal axes to permit connections in the horizontal and vertical planes. In this regard, the head 20 can accommodate whatever topological features may exist on the MCM surface such as connections of uneven heights, vertical to horizontal, etc. (See FIG. 2B). The head may be controllably driven by a number of micro motors in response to control signals and accurate positioning may be ensured by utilizing feedback signals from optical encoders or the like. In the case of an assembly line process, where the same connections are repeatedly made, a stored computer program is used to manipulate the routing head between connection points. The routing head 20 contains a spool 22 for holding a length of the preexisting fiber 24, which is laced through a connecting tip 26. The spool 20 is preferably tensioned to keep stiff fibers from unwinding. The connecting tip 26 unwinds fiber from the spool 22 using optical fiber guides (not shown) for connection and routing. Care should be taken when adjusting the spool tension such that the fiber is not unduly stressed while fed through the connecting tip.

The preexisting fiber 24 is fed through the connecting tip 26 and extended a predetermined distance beyond the end of the connecting tip 26. This preexisting distance is determined by the connection fiber qualities, such as fiber size, stiffness, etc. In addition, a heat source 30, proximal to the routing head 20, is used for making the fiber connections as will be discussed below. In particular, the heat source 30 is used to soften the end of the fiber 24 for connection to a chip surface 38 or other structure associated with an optical port. In the illustrated embodiment, the heat source 30 is a laser. When using a laser heat source, the laser should be chosen and operated to optimally correspond with fiber qualities. A non-inclusive list of laser characteristics and operating parameters which may be selected and adjusted based on characteristics of the fiber and the particular application includes: optical intensity, wavelength, time profile of laser power and focused spot size. For example, a 10 Micron wavelength $CO_2$ laser may be used to heat glass fibers since glass readily absorbs 10 Micron wavelengths. Regardless the heating method used, localized heating is preferable such that the connection fiber 24 may be heated without unduly heating other nearby components that may be damaged by high ambient temperatures. A 10 Micron wavelength $CO_2$ laser, for example, may easily be focused onto a 20–30 micron area minimizing the area affected by the heating.

The illustrated laser is mounted proximally to the routing head 20 such that it may be easily focused on the fiber end 27, the chip surface 38, and the full length of the fiber 24 between optical ports after connections are made, as will be more fully discussed herein. The illustrated routing head 20 also contains a mechanical element or 'pawl' 32 to force the longitudinal axis of the connection fiber 24 into contact with optical ports as will further be described below.

INITIAL CONNECTION

Figure 4A:
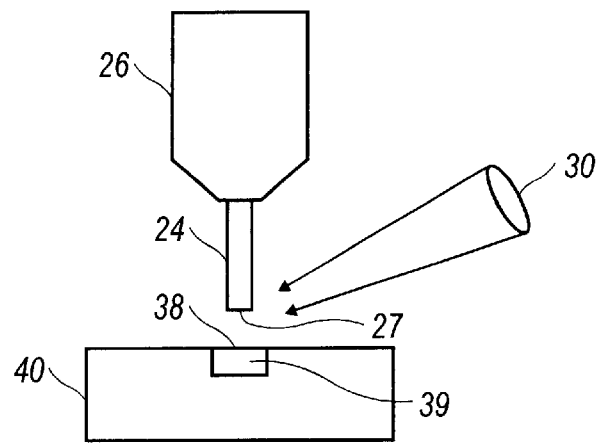
FIGS. 4A–4C are side views of connections between a fiber end and an optical port surface in accordance with the present invention.
Figure 4B:
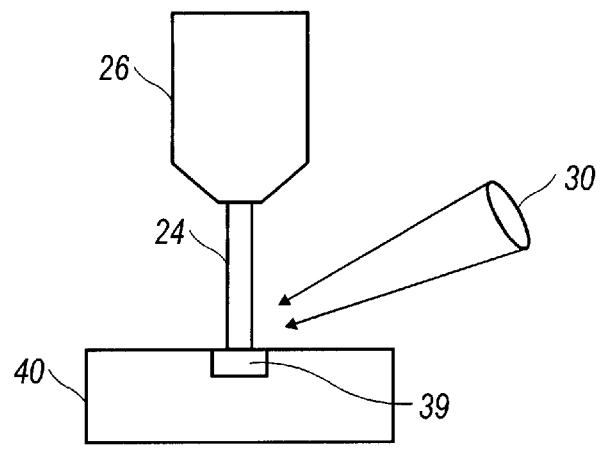
Figure 4C:
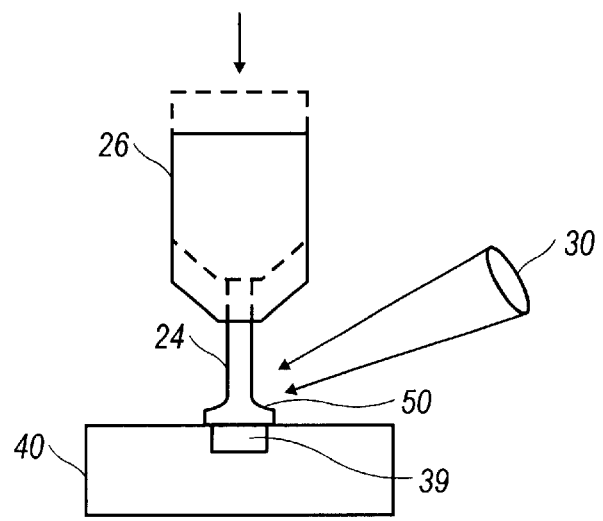

Referring to FIGS. 3, and 4A–4C, for an initial connection, the end of the preexisting fiber 27 is positioned so that it extends out of the routing head connecting tip 26 and is disposed above the connection surface 38 as shown in FIG. 4A. The chip surface 38 may be an upper or lower surface of an optoelectronic chip 40. The fiber can be aligned above the optical port 39 of chip 40 using certain mechanisms and processes, as will be more fully described below. Once correctly aligned, the end of the connection fiber 27 is heated, using the localized heat source 30, to reduce the fiber's viscosity (i.e. soften the fiber). The chip surface 38 may also be heated to improve bonding between the fiber 24 and the optical port 39. Alternatively, as shown in FIG. 4B, the connecting fiber end 27 may be brought in contact with the chip surface 38 prior to heating in which case the localized heating source 30 may be used to heat both the chip surface 38 and the connection fiber 24 simultaneously. As will be appreciated, heating the chip surface 38 of the optical port 39 provides for a better surface adhesion bond between the fiber and the port. Although the fiber end 27 is shown as having a clean cut or 'square' end, it will be appreciated that the fiber end 27 need not be neatly trimmed before connections are made. In the implementation of FIG. 4A, once the fiber 24 is softened to a predetermined point, the routing head 20 moves the fiber 24 into contact with the chip 40 and presses the fiber against the chip connection surface 38. See FIG. 4C. The force exerted by the routing head 20 expands the end of the connection fiber 24 as shown in FIG. 4C.

Figure 5:
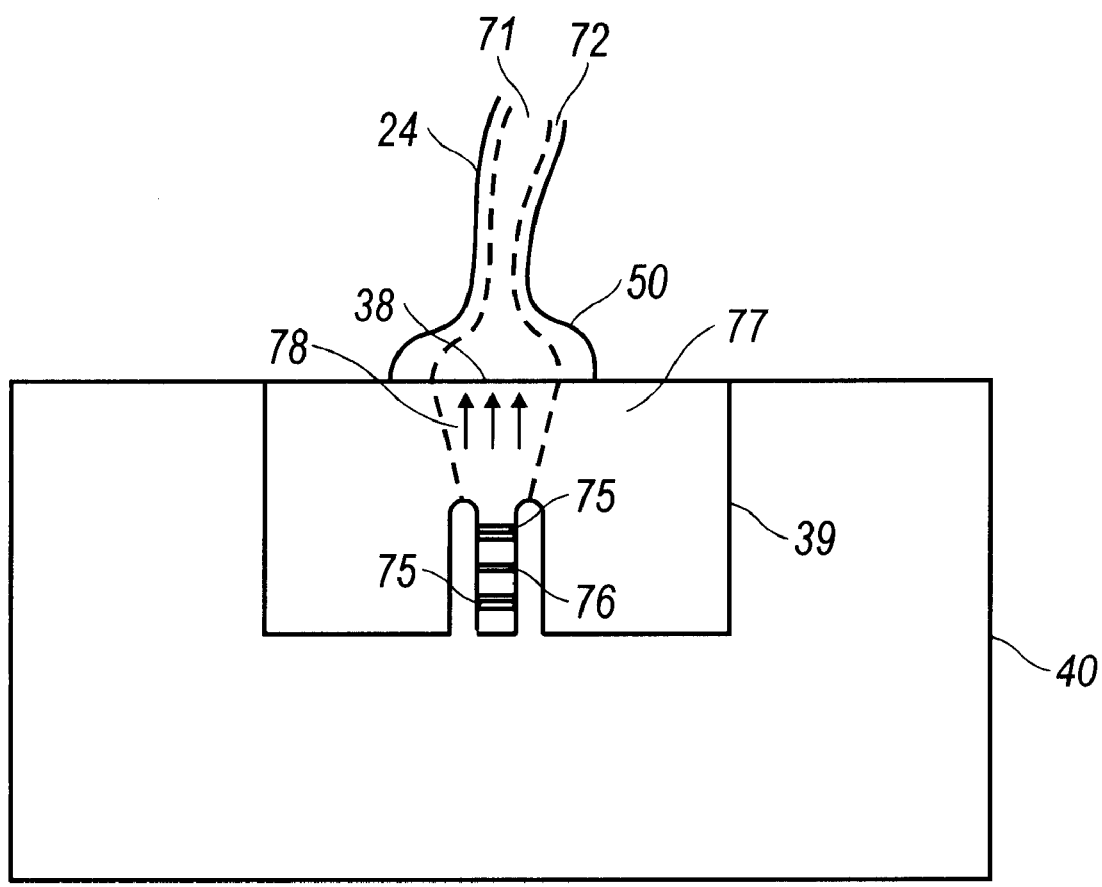
FIG. 5 is a close-up plan view of a fiber end connected to an optoelectronic emitting port in accordance with the present invention.

FIG. 5 shows the resulting expanded section 50 as well as certain details of the port 39. In FIG. 5, the fiber 24 includes a core 71 and a cladding 72. The fiber 24 establishes a connection to the optical port 39 (a VCSEL in the illustration) incorporated in an optoelectronic chip 40. In the illustrated embodiment, the VCSEL 39 has two mirror stacks 75 and an active region 76, which emits light 78 through a substrate 77. As will be appreciated, the expanded section increases the contact area between the chip surface 38 and the fiber 24, thus increasing the adhesion bond strength. The expanded section 50 also increases the optical interconnection coupling area allowing more light 78 to enter into the optical fiber 24 from the optical port 39. Typically, good coupling efficiency can be obtained when the connection fiber has a core diameter 20–50% greater than the emitter diameter. For example, the expanded section 50 will allow a connection fiber 24 with a core diameter of 12–15 microns to efficiently attach to a light emitter 76 with a 10-micron diameter. As will be appreciated, the expanded area 50 allows for a small margin of error when aligning the connection fiber with the optical port.

ROUTING

Figure 6:
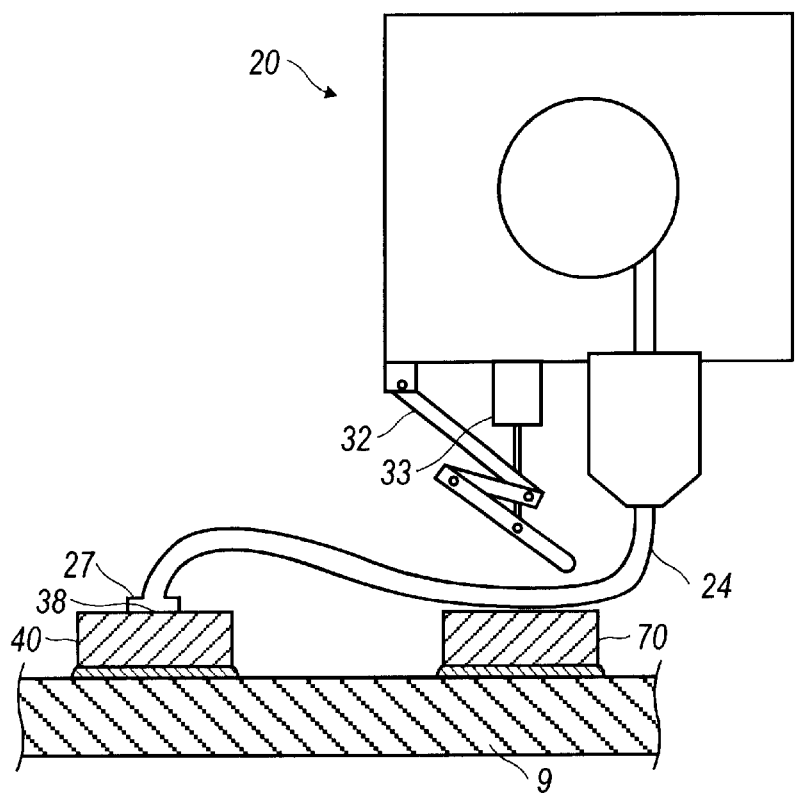
FIG. 6 is a plan view showing an apparatus for routing a flexible optical fiber between chips on an MCM in accordance with the present invention.
Figure 7:
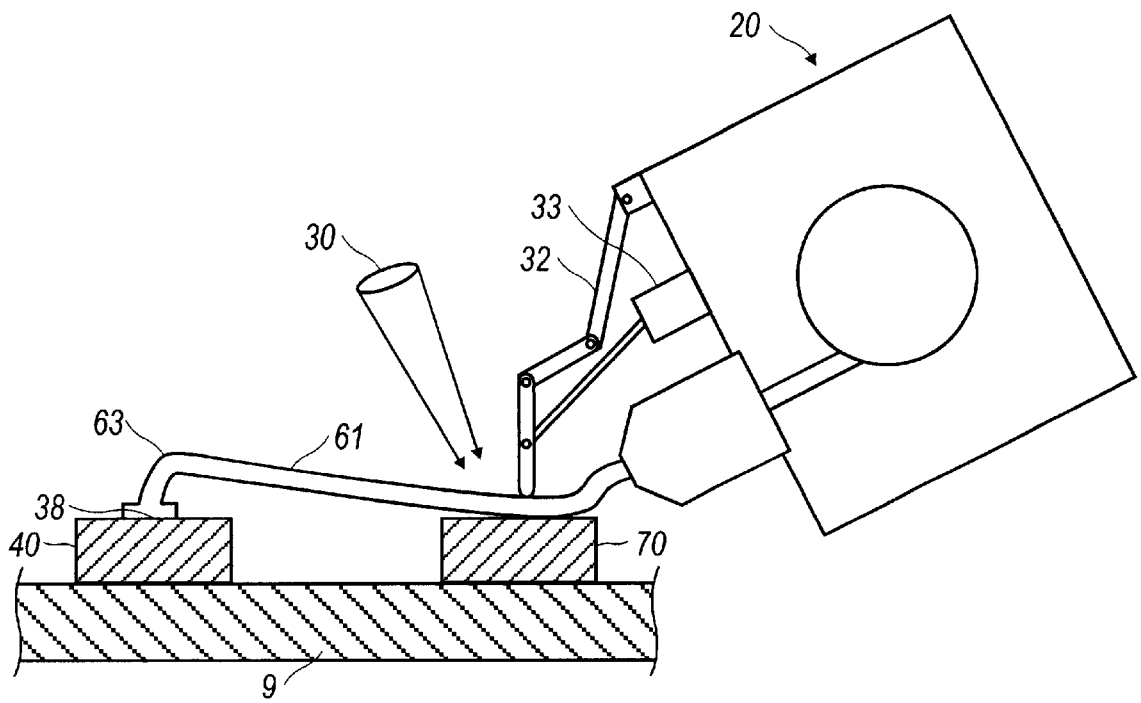
FIG. 7 is a plan view of an apparatus for routing a stiff optical fiber between chips on an MCM in accordance with the present invention.

Referring to FIGS. 6 and 7, after attaching the fiber end 27 to the optoelectronic chip 40, the optical fiber 24 is routed to another electronic chip 70 in the illustrated application. In the case of an assembly line type process, the routing will be performed automatically by computerized control to make a predetermined pathway between two or more predetermined coordinates on the MCM. As will be appreciated, the optical pathway connection distances on a typical MCM may range from a few $\mu$m to several mm. Typically, optical fibers with a diameter of 20 microns require a minimum-bending radius of a few millimeters to bend without causing surface fractures or fiber failure. This can be problematic if the MCM topology does not provide enough room for the desired bend radii between connections. If the fiber is sufficiently flexible and there is sufficient space between the connection points the routing process is quite simple. As shown in FIG. 6, a flexible fiber 24 may be draped onto the second optoelectronic chip 70 for connection thereto. However, if the fiber is stiff, routing of the fiber becomes more difficult. In this regard, the routing head 20 may be rotated sideways to pay off the stiff fiber 61 (See FIG. 7). Additionally, when routing a stiff fiber 61, the heat source 30, used for making the initial connection, may be used to soften the fiber 24 during routing. In the embodiment of FIG. 7 the heat source 30, is focused on the stiff fiber as it leaves the routing head connecting tip 26. As will be appreciated, the heating allows the fiber 24 to make sharp bends 63 smaller than the normal fiber-bending radius without breaking or causing surface fractures in the fiber or without over-stressing the fiber-chip contact 38. It should be noted that if the fiber bend radii are too small, light within the fiber might be incident on interface between the optical fiber core and cladding with an angle great enough escape the optical fiber.

SECOND CONNECTION

Figure 8:
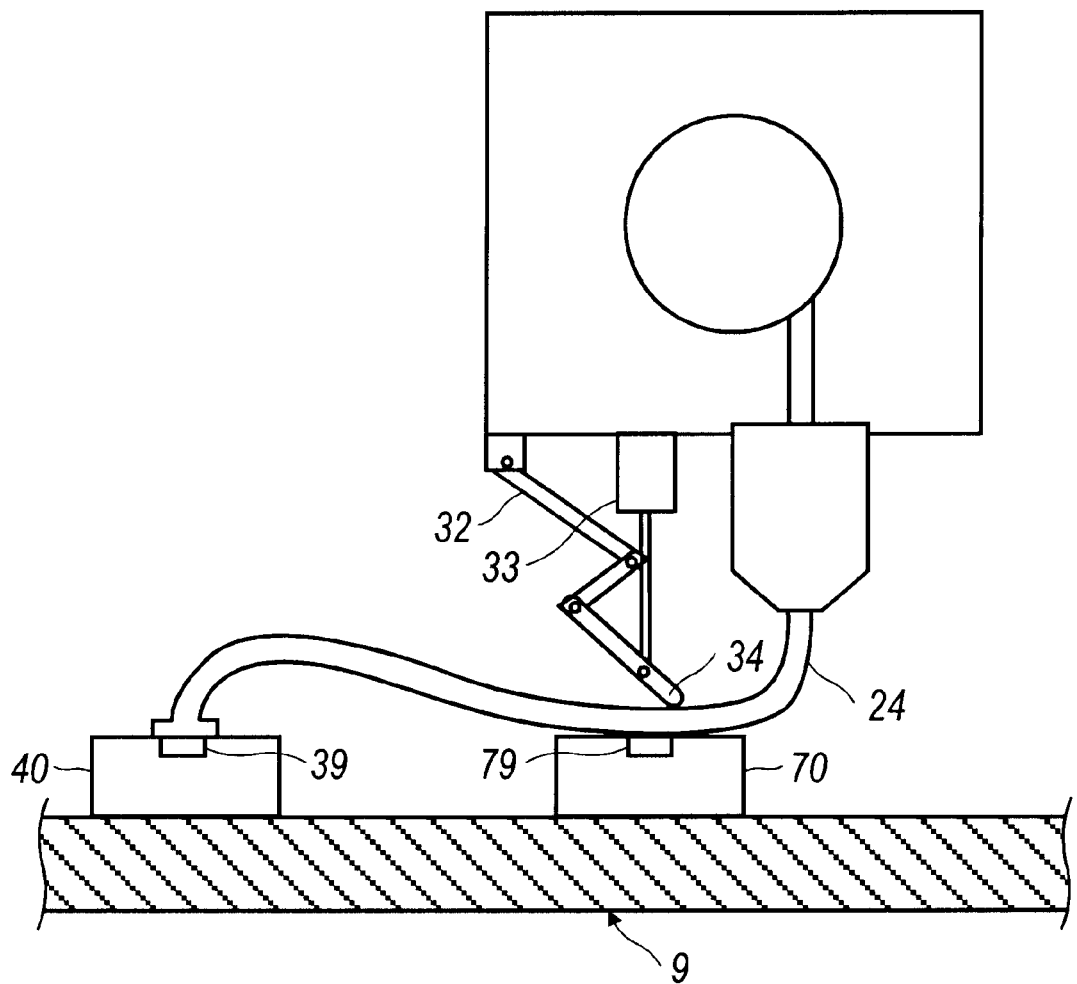
FIG. 8 is a plan view of an apparatus for forming optical connections relative to chips on an MCM in accordance with the present invention.

To make a second connection, the fiber 24 is brought into proximity with a light detector 79 on a second chip 70 (See FIG. 8). Due to fiber stiffness, an external force will generally be required to bring the fiber 24 into contact with the second chip 70. In the illustrated embodiment, the mechanical pawl 32 presses the longitudinal axis of the connection fiber 24 into contact with the second chip 70. The illustrated routing head 20 includes an actuator 33 for engaging the pawl 32. The pawl 32 may be connected to the routing head 20 such that the pawl 32 and routing head 20 move as a single unit to reduce complexity of the apparatus. Preferably, a pawl is used that allows the fiber 24 to be heated while being held in place. For example, when using glass fibers and a 10 micron $CO_2$ laser for heating, a pawl 32 with a transparent tip 34 made of diamond or ZnSe may be used as both diamond and ZnSe are transparent to 10 microns of radiation. Using a transparent pawl tip 34 allows heating the optical fiber 24 and optical port 79 through the pawl tip 34 while the fiber 24 is held in position. However, other materials and other heat sources may be appropriate for other fiber/port combinations.

Figure 9A:
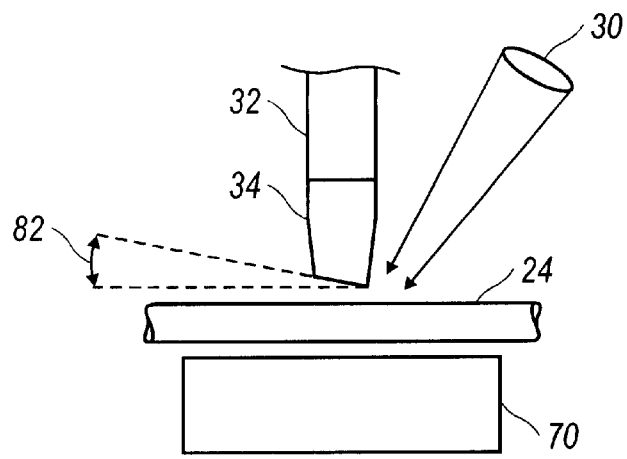
FIGS. 9A–9C illustrate operation of a mechanical element to press an optical fiber to a chip surface and severing the fiber in accordance with the present invention.
Figure 9B:
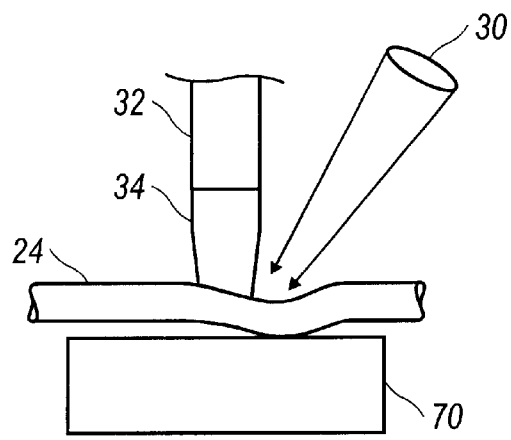
Figure 9C:
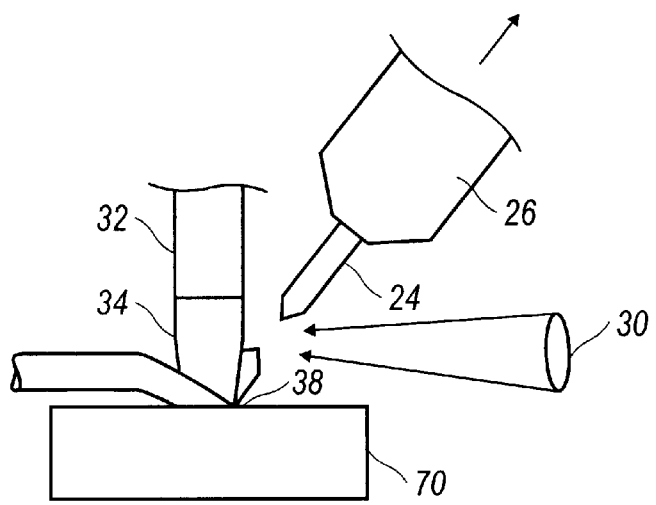

As shown in FIGS. 9A–9C, the pawl tip 34 under control of actuator 33 urges the fiber 24 into contact with the chip 70. Depending on the fiber and optical port material properties, the localized heating source 30 may be used to heat the connection fiber 24 before, during and/or after the pawl presses the fiber 24 into contact with the second chip 70. Additionally, the heat source 30 may continue to heat the fiber 24 and chip 70 for some time while the pawl tip 34 holds the fiber 24 in place. In this regard, a pre-programmed time profile for adjusting the heating parameters over time may be used to drive the heat source 30. After heating, the pawl 32 may remain in place for a predetermined time to allow the adhesion bond between the connection fiber 24 and the chip 70 to strengthen as the fiber/chip interface cools. Once the interface has sufficiently cooled, the fiber 24 may be severed. As shown in FIG. 9C, such may be accomplished by using the pawl 32 to hold the fiber 24 in place while the connection fiber 24 is heated at a point beyond the connection interface until sufficiently soft, at which time the routing head 20 moves away, thus, severing the fiber 24. As will be appreciated, the pawl 32 is required to be movable relative to the routing head 20 to allow the routing head to move away while the pawl 32 holds the fiber to the connection surface. The illustrated pawl 32 includes an articulated arm to allow such relative movement. This severing process reduces stress to the freshly made connection.

To assure good coupling efficiency between a fiber and a detector, generally the detector will need to be larger than the fiber core e.g., at least about 2–3 times as large as the fiber core. For example, a detector having a 20–30 micron diameter will provide good coupling efficiency with a 12–15 micron fiber core.

Figure 10:
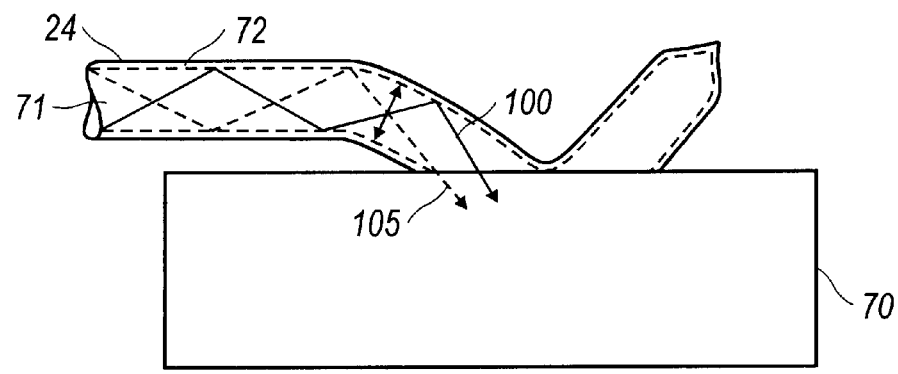
FIG. 10 shows a side view of a connection of an optical fiber to an optoelectronic detecting chip formed in accordance with the present invention.

The pawl tip 34 is shaped to create a 'neck' in the fiber at the attachment point (See FIGS. 9A, 9B and 10). The narrowing of the connection fiber 24 cross-section creates this neck 100, which increases the angle at which light 105 contacts the interface between the core 71 and cladding 72. The increased incidence angle allows light 105 to penetrate the cladding 72 and impinge on the detector chip 70. The shape of fiber neck 100 can be controlled in part by the angle 82 of the contact surface of the pawl tip 34. For example, a pawl tip 34 with a sharp contact angle 82 will create a strong neck in the fiber 24, allowing most or all photons 105 to escape. In contrast, a pawl tip 34 with a gentle contact angle 82 will result in a weaker neck resulting in fewer photons exiting the fiber 24, thus allowing the remaining photons to continue down the fiber where they may establish a connection with another optical port, as will be described more fully below. In addition to the shape of the pawl tip 34, the amount of force the exerted by the pawl 32 and the viscosity of the fiber 24 due to heating will also affect the shape and dimensions of the neck 100. For example, a very soft fiber may be pressed nearly flat to the chip surface with a moderate pawl force, resulting in near complete photon exit, whereas a fiber having a higher viscosity may retain a more of its original cross section after being pressed with the same pawl force, allowing some photons to exit and some to continue down the fiber.

CHAIN-LINK AND BUS CONNECTIONS

Figure 11:
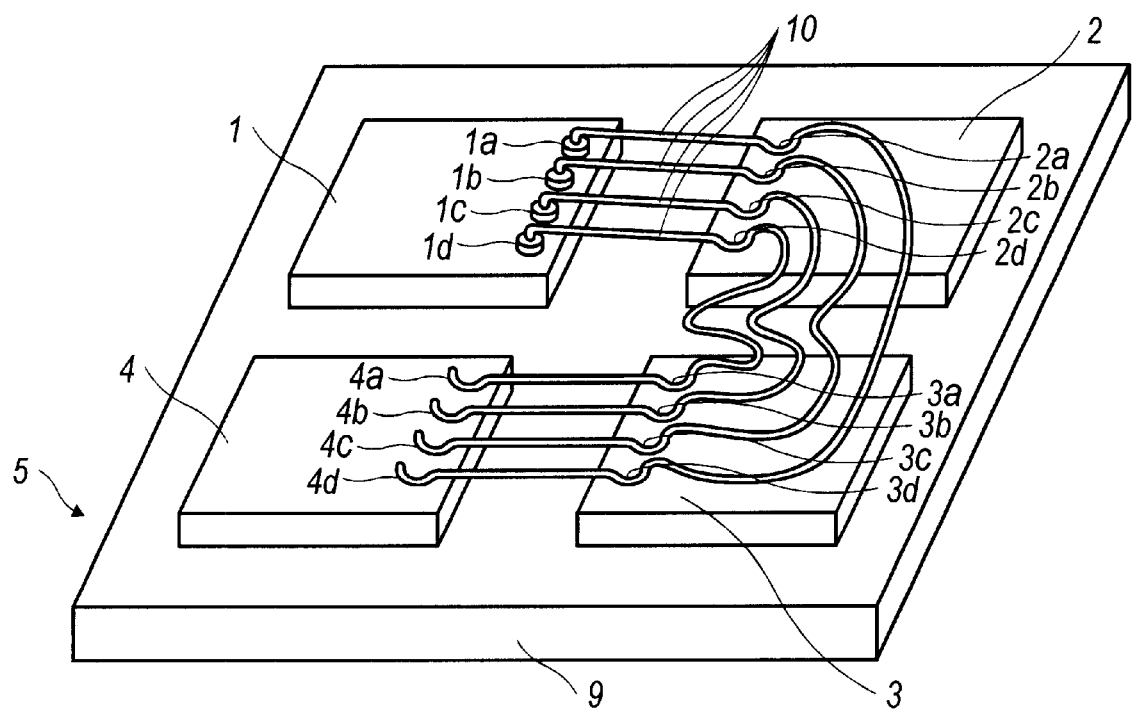
FIG. 11 is a perspective view of a Multi Chip Module (MCM) containing optical bus interconnections between multiple chips in accordance with the present invention.

The present invention can also be utilized to make chain-link and bus interconnections between multiple optical ports. As shown in FIG. 11, a group of optoelectronic chips 6-1-4 on a multichip module 5 may be interconnected using chain-link and bus connections. As used herein, "chain-link connections" refer to serial connecting formed using a single fiber, and "bus connections" refer to parallel connections between multiple ports or chips using multiple fibers. For example, terminal 1A of chip 1, an emitting terminal, may be serially connected to receiving terminals 2A, 3A and 4A of chips 2, 3 and 4 respectively, using a single optical connecting fiber 24 to define chain-link connections. In addition, terminals 1B, 1C, 2B–D, 3B–D and 4B–D, and 1D may each be connected to their respective receiving terminals 2B–D, 3B–D and 4B–D on the MCM 5. This creates a series of parallel optical pathways 10 between the optoelectronic chips 6, thereby defining a bus connection. Necking the fibers 10 such that some photons exit at each intermediate optical port (of chips 2 and 3) enables the chain-link connections.

Figure 12:
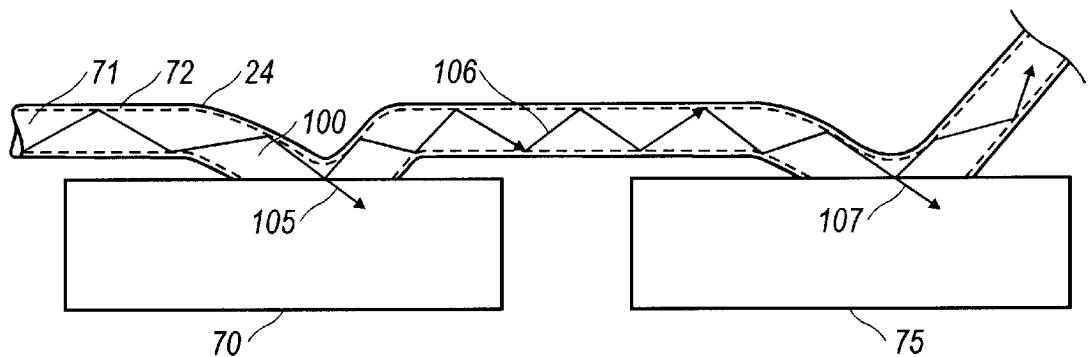
FIG. 12 shows a side view of an intermediate fiber connection and a terminating fiber connection on optoelectronic detecting chips in accordance with the present invention.

As shown in FIG. 12, a connection fiber 24 with a core 71 and cladding 72 is connected to a first chip 70 such that part of the photons (generally indicated at 105) penetrate the cladding 72 at the neck 100 to establish an optical connection with the optoelectronic chip 70 while a remaining portion of the photons 106 are able to continue through the fiber 24 where additional photons 107 establish a connection with a second optoelectronic chip 75. Though FIG. 12 shows only two intermediate connections, numerous intermediate connections are possible and within the scope of this disclosure.

The use of preformed optical fibers for establishing connections as discussed above also facilitates the creation of bus connections since the optical pathways may be laid next to one another with minimal cross talk. As known by those skilled in the art, in the case of wire/electrical bus connections, if non-insulated wire connections are closely adjacent or touch one another they may produce intraactive electromagnetic effects in one another. Additionally, if insulated wires cross on top of or touch one another, electromagnetic communication or cross talk may still occur between the wires. Optical fiber connections reduce or eliminate the cross talk problem since signals are communicated as light (visible spectrum or otherwise) with minimal field effects outside the fiber. Therefore, optical fibers may cross on top of each other or even touch one another substantially without the cross talk inherent in wire connections. However, there may still be a small amount of light leakage from the fibers (at sharp bends for example), which could result in cross talk between fibers. To farther reduce the possibility of cross talk, cladded optical fibers are preferably used for multiple connections. Additionally, a black potting material may be applied after all connections are made to absorb any stray light, which may leak from bends in the fibers. The interconnections as shown in FIG. 11 are a simple example, however, the use of numerous fibers in a substantial maze is possible and within the scope of this disclosure.

SYNCHRONIZED TIMING OF ELECTRICAL MODULES

Figure 13:
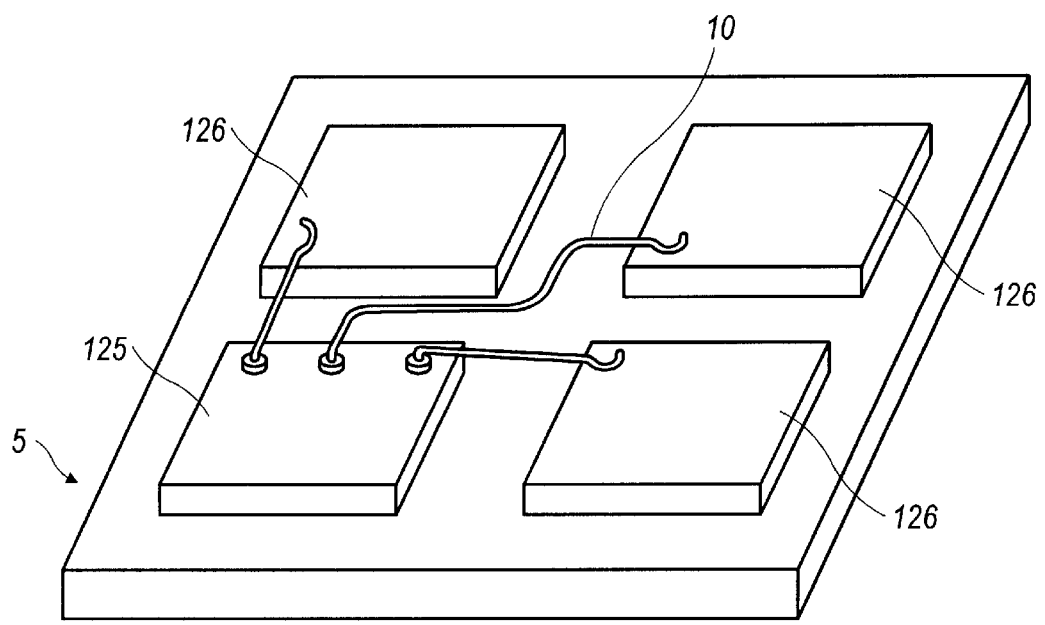
FIG. 13 is a perspective view of a Multi Chip Module (MCM) containing a master clock chip connected to multiple timed chips in accordance with the present invention.

Another advantage of using the fiber optical connection methodology as discussed above is that it facilitates the synchronized connection of multiple timed modules 126 on an MCM 5 to a master clock generator 125 (See FIG. 13). Commonly, a number of different timed modules 126 may be present on a single MCM 5 that require synchronization for proper system performance. In modem computing systems, where the processing speeds are reaching 1GHz, the RCL associated with standard wire connection makes timing difficult amongst separate modules due to resistance, capacitance and inductive losses. Optical connections reduce or eliminate the RCL problems associated with wire coupling. However, the optical connection speed (i.e. the speed of light in the connection fiber) can result in appreciable signal delays in optical communication systems. For example, light travels in glass at five (5) ps/mm. Therefore, to synchronize multiple units, it may be desirable to route their optical connections to have equal lengths or to have a known length relationships that can be accounted for in processing. In either case, accurate path length control is desirable. As shown in FIG. 14, a master clock generator 125 is connected to three timed modules 126 on an MCM 5. The optical fiber pathways 10 between the master clock generator and the timed modules 126 have been routed to have equal lengths. Optical 'trombones' 130 are used to increase the length of the shortest connection to the length of the longest connection. This forming of the optical fibers can be achieved by using a heat source in combination with a routing head, as discussed above, to form the desired bends. Using this method, fibers may be routed to have a length accuracy of better than +/−1 mm.

If fiber lengths are still not equalized sufficiently for accurate clock pulse distribution, the fiber lengths may be adjusted after connection. Referring to FIGS. 15A–15C, the initial shape of an optical trombone is shown in FIG. 15A. Heating and stretching a section of an optical trombone 130 using a heat source 30 and pawl 32 may lengthen a fiber (See FIG. 15B). The illustrated mechanical pawl 32 provides a tensile force to stretch the fiber. As shown in FIG. 15C, shortening is accomplished by heating two sections 135, 136 of an optical trombone 130 until nearly molten. Once nearly molten, the surface tension of the fiber material draws a section of the fiber into a ball and shortens the fiber.

HEAT TREATING

After all post connection adjustments are made, it is desirable to relieve any internal fiber stresses. Though the connection fiber is heated during routing, bending can still produce internal fiber stresses. After connection, these internal stresses are generally transferred to the fiber's connection points, the adhesion bonds. These transferred stresses can create a shear force at the bond site which, left untreated, can cause bond weakening or failure. Additionally, the routing and connection process may cause micro-fractures in the connection fiber's optical core, which may allow light leakage and/or cause premature connection fiber failure. To alleviate these problems, the optical pathways are heated along their length after connection using the localized heat source. The heating again softens the fiber relieving internal stresses and helps seal any micro-fractures that are present in the fiber core. This is accomplished by retracing the optical pathway and employing the heat source to heat the fiber adequately to alleviate these problems without deforming the pathway from its desired shape/dimension. The specific heat source operating parameters in this regard will depend on various factors, including the natures of the heat source and fiber.

ACTIVE ALIGNMENT

Referring to FIGS. 16, 17A and 17B, a system for active alignment of an optical fiber with an optical port is presented. Alignment of the connection fiber end 27 with the optical port 39 can be difficult for several reasons. In the case of an optical emitting port 39 the active or light outputting regions 76 are generally very small, typically measuring from 5–50 microns. FIGS. 17A and 17B show a common construction of a VCSEL for use in an optoelectronic chip. The VCSEL 80 contains an active region 76, where combination of electrons and holes produce photons surrounded by mirror stacks 75, 79 on top and bottom. One of the mirror stacks 79 is somewhat transmitting allowing photons to escape as light output 78. If the light emitter 39 is a top emitter, as shown in FIG. 17A, the emitting structure is generally easily visible for easy fiber alignment. However, as shown in FIG. 17B, it is a common practice to mount light emitters 39 such that their light emissions 78 are emitted through the chip substrate 77. While the substrate 77 does diffract the produced light beam 78, thus increasing its diameter and, therefore, the efficient attachment area, the optical port 39 is hidden from view, making connection difficult. Existing wire connector systems used in connection with such devices employ a camera system to identify a module structure on an MCM and relay this information to a microcomputer for alignment. The computer then adjusts the position of the connector based on stored information as to where the connection port is located in reference to known structure on the MCM. This system works well for wire connections since the "ports" to which wire connectors attach are typically larger than optical ports and slight variations in the relation of a module to other structures on the MCM generally do not affect the connections. However, for optical connections, a slight variation in one module's orientation relative to other modules on an MCM may result in an ineffective connection due to the small size of the optical ports. Therefore, it is desirable to actively align a longitudinal axis of the fiber 24 with the port 39 during connection to assure good optical coupling.

Referring to FIG. 16, active alignment is performed by disposing an optical fiber end 27 near a connection port 39 and transmitting a signal through the fiber 24 relative to the port 39. The position of the connection fiber end 27 is adjusted to maximize the signal transmission between the port 39 and the fiber end 27. In the illustrated embodiment where the port 39 emits optical signals, a fiber 24 is routed through a routing head tip 26 for connection. The second end of the fiber 25 is connected to an optical device 41 capable of at least receiving optical signals. Additionally, the optical device 41 is able to measure the intensity of any signals received. When connecting a fiber 24 to a light emitting port 39, the port 39 is driven to produce an output signal, which is monitored through the connection fiber 24 by the optical device 41. The intensity of the emitting port output signal is measured by the optical device 41 and relayed to a control circuit 46 composed of, for example, a microcomputer that controls routing head 20 position. Once the routing head 20 is positioned such that the output signal is maximized, the softening and contacting process described above is performed to create an optical connection.

TELECOMMUNICATIONS FIBERS

Figure 18:
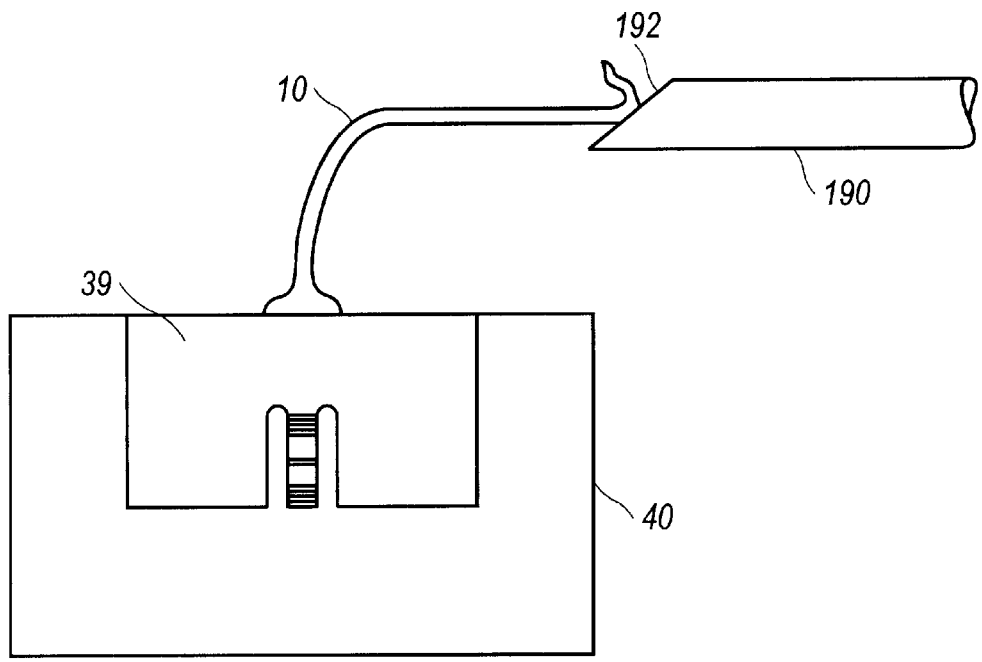
FIG. 18 is a side view of an optolelectronic chip attached to a telecommunications fiber in accordance with the present invention.

Referring to FIG. 18, the present invention also enables optically linking an optical port 39 on a computer chip 40 directly to a telecommunications fiber 190. Often a communications fiber 200 has an outside diameter around 125 microns with an inside core diameter ranging from 10 (single mode) to 62.5 (multimode) microns, making the telecommunication fibers too large and stiff to directly connect it to an optoelectronic chip port 40 which may be as small as 10 microns in diameter. To perform a direct telecommunications/optical port connection, the end of a telecommunications fiber 190 is cut at an angle 192 to provide a good bonding area for the connection fiber 24 as well as improve optical transmission across the resulting interface. Then the routing head 20 performs the softening and contacting procedure described above to attach the optical port 39 and telecommunications fiber 190 with an optical fiber pathway 10. Typically the interconnecting fiber 24 will be from 10 to 20 microns in diameter with a core diameter of 8 to 10 microns, thus, being thin and flexible, the interconnect fiber 24 can absorb relative movements of the optoelectronic chip 40 and communications fiber 190 due to thermal changes. This is advantageous because it relieves the thermal design, for expansion and contraction, which is required in current telecommunication designs.

FORMING OPTICAL CONNECTIONS USING A LIGHT-CURABLE LIQUID

Figure 19:
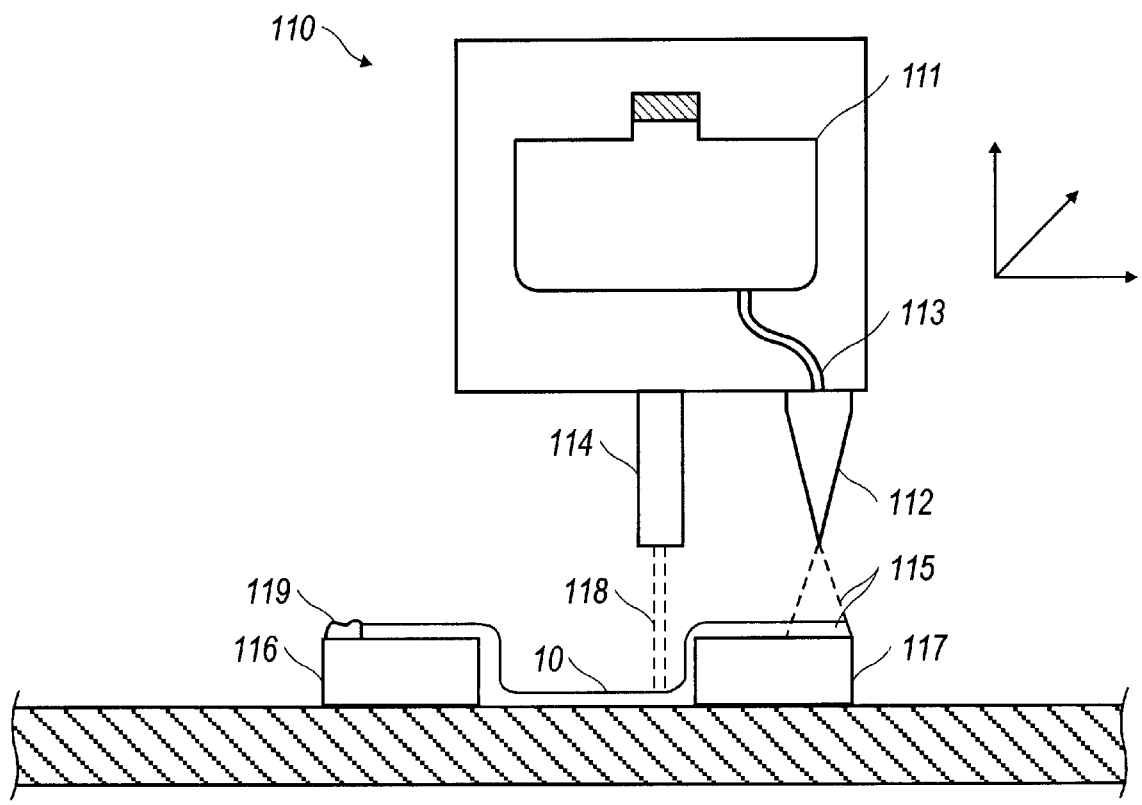
FIG. 19 illustrates an apparatus for dispensing liquid material and selectively curing the material to form optical wave lengths.

Referring to FIG. 19 another embodiment of the present invention is shown. In FIG. 19, a structure for forming optical connections between optical ports using an Ultra Violet (UV) light-curable liquid is presented. A modified routing head 110, which is able to move freely in three dimensions, is used to perform the optical connections. As shown, the routing head 110 further comprises a holding tank 111, a dispensing nozzle 112 and tube 113 interconnected therebetween. In addition, a focused UV light source 114 is attached to the routing head 110. As in the above embodiments, the routing head 20 may be controllably driven over pathway between multiple optical ports. However, in this embodiment, the nozzle 112 dispenses or 'floods' a light-curable optical liquid 115 (e.g., polymer or glass) from the holding tank 111 over the pathway between optical ports 116 and 117. The UV light source 114 focuses UV light 118 on the light-curable optical liquid 115 as the routing head moves between the ports. Upon exposure to the UV light, the light-curable optical liquid solidifies creating an optical pathway 10. Once all desired pathways are formed, the area is flooded with a solvent to remove any of the uncured optical liquid 119.

Forming optical connections using the light-curable optical liquid provides several key advantages. For example, since the optical pathways are formed in place, there are no internal stresses that may be transferred to the optical port connections. Additionally, any shear stresses experienced from MCM thermal expansion are distributed over the entire length of the fiber since it typically rests on the MCM surface as opposed to propagating through space between connection points. As will be appreciated, the UV line forming method and structure is operable to work with all the embodiments described above such as forming chain-link and bus connections.

PROCESS FOR CONNECTING TIME-DEPENDENT CHIPS ON A MCM

Figure 20:
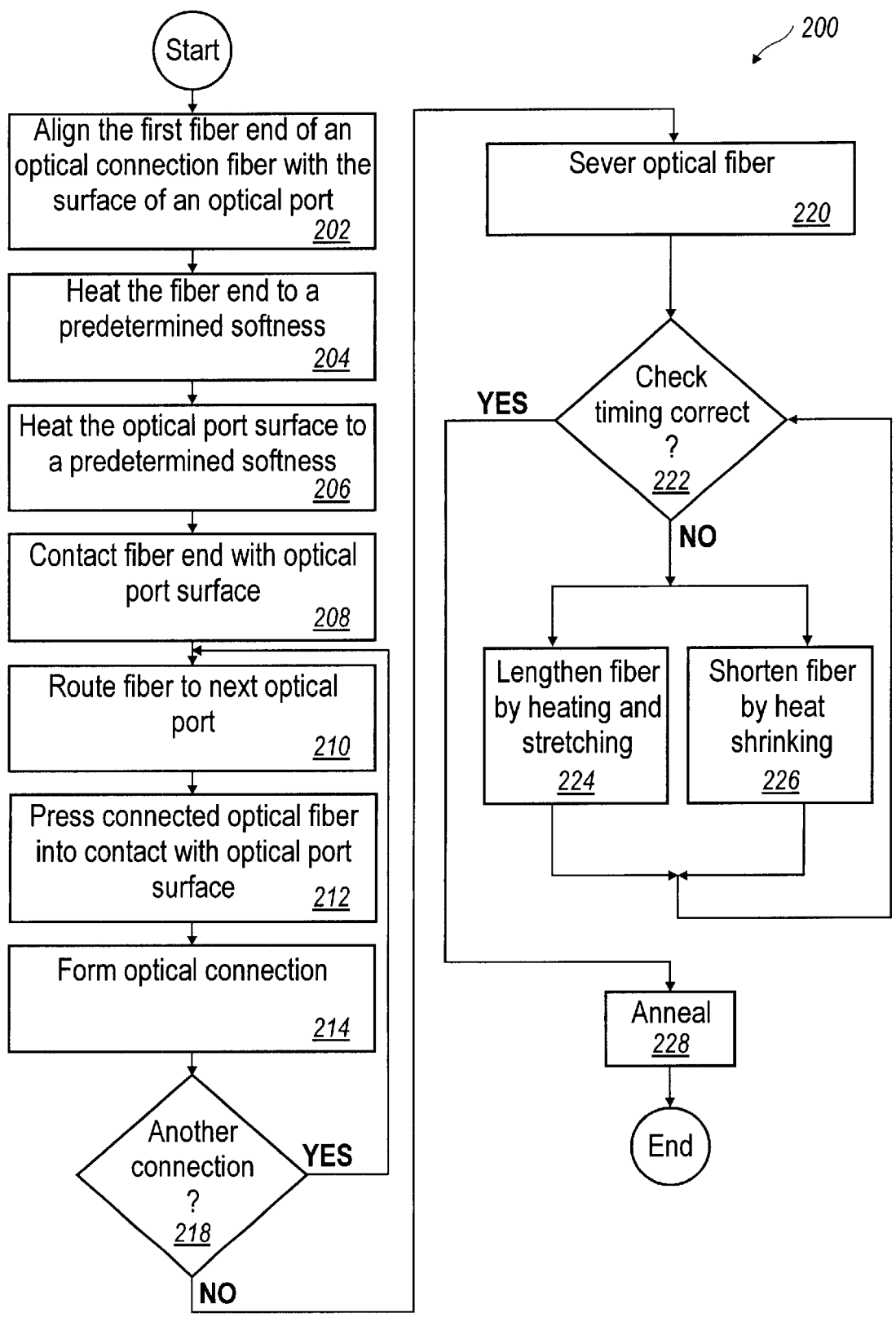
FIG. 20 is a flow chart illustrating a process for attaching time-dependent chips to a master clock chip on a MCM in accordance with the present invention.

The processes of the present invention will now be summarized by reference to the flow chart of FIG. 20. Referring to FIG. 20, a process 200 is set out for forming optical pathways between a master clock chip and at least one time-dependent chip on a Multi-Chip Module (MCM). The process 200 is initiated by aligning (202) an optical fiber end above an optical port surface. As noted above, several methods are available for aligning the fiber with the port. If the optical port is mounted such that its active region is visible, fiber alignment may be done visually or using alignment marks on the optoelectronic chips. Alternatively, if the optical port is not visible, the fiber may be actively aligned as described above to assure that the connection fiber will receive optical signals from (or transport optical signals to) the optical port. Additionally, in the case of an automated process, the optical port coordinates may be preprogrammed into a computer that controls the fiber alignment. Once properly aligned, the optical fiber will be perpendicularly disposed to the optical port surface.

After alignment, a laser heats (204) the connection fiber end to soften the fiber for connection. Preferably, the laser can be focused to locally heat only the desired components, thus preventing damage to other nearby electrical components. Additionally, the laser may also heat (206) the optical port surface to help soften the port's surface for connection. Once the fiber and/or the port's surface are softened to a predetermined level, the fiber end is brought into contact (208) with the optical port surface. Contacting the fiber with the optical port surface entails moving the routing head towards the optical port surface until the fiber end touches the port surface and then moving an additional predetermined distance towards the port surface after initial contact. This additional movement expands the fiber end on the optical port surface. The expanded fiber end increases the contact area between the fiber and optical port surface allowing for better optical transfer therebetween and increasing the bonding area. An adhesion bond is created between the softened fiber end and softened port surface upon cooling.

After the adhesion bond between the optical port and connection fiber has sufficiently cooled, the connection fiber is routed (210) to the next optical port. During routing, the laser may be used to heat the fiber as it leaves the routing head, allowing the fiber to conform to the MCM topology between optical ports. The heating also enables the fiber to make small radius turns during routing process, thus allowing connections between optical ports over the short distances typical on a MCM. Additionally, such routing 210 may be repeated with respect to multiple fibers originating from a master clock chip to multiple time-dependent chips. In this situation, the optical connections between the master clock chip and all the time-dependent chips are routed to be of equal lengths. These equal length optical connections help synchronize the timing of the chips, as will be discussed below.

After routing the fiber to the next port, the connection fiber is pressed (212) into contact with the optical port surface using a mechanical element or 'pawl.' Such pressing generally involves application of a force directed transverse to the fiber's longitudinal axis. Once the fiber is in contact with the optical port, a second connection is formed (214) using the laser to heat the fiber and port. As above, this heating creates an adhesion bond between the fiber and the optical port optically connecting the two.

Once connected between at least two ports, the fiber may make additional connections (218) or be severed (220). If additional connections are desired, steps 210 through 214 are repeated. If the fiber is to be severed 220, the laser heats the connection fiber at a point beyond the last connection until nearly molten. Once the fiber is sufficiently soft, the routing head moves away, severing the fiber. During the severing process, the pawl continues holding the last fiber/port connection to prevent stressing the newly formed adhesion bond during severing. After the routing head has severed the fiber, an optical pathway exists between the first optical port and all optical ports attached hereto.

At this point, the length of the optical pathways between the ports may be adjusted if chip timing 222 as initially tested is sufficiently accurate for synchronization purposes. To determine chip synchronization, the MCM is operated and the timing of each chip is measured (222). If the chip's timing is correct, no optical pathway adjustments are required. However, if any of the chips is receiving signals too early or too late, the optical pathway connecting that chip with the master clock chip may be lengthened or shortened. Lengthening 224 is accomplished by heating a section of the optical pathway connecting the chip and the master clock chip and mechanically stretching the pathway. Again, a laser heats the optical pathway until soft and the pawl applies a tensile force to stretch the pathway. Alternatively, the optical pathway may be shortened (226) using a laser heating method. The optical pathway is shortened by heating at least one section of the pathway until nearly molten. When the fiber approaches the molten state, surface tension causes the near molten section to ball drawing the ends of the optical fiber together, thus shortening or 'shrinking' the fiber.

Once optical pathway adjustments are made, MCM timing is again checked 222. If the timing is still insufficiently accurate, the above steps 224 or 226 are repeated, as the case may be, to further adjust the optical pathway lengths. Once all length adjustments are completed, the fibers may be annealed (228) to improve their optical performance. Annealing involves using the laser to reheat the entire length of each optical pathway. This heating relieves internal fiber stresses from the routing process that may cause shear forces at the connection points and possibly cause bond failure. Additionally, this heating helps seal micro-fractures on the optical pathway surface that may have appeared during the connecting and routing processes. Left untreated, these micro-fractures may cause light leakage and/or premature optical pathway failure.

It will be appreciated that the process 200 may be modified from the illustrated embodiment in terms of the number or ordering of the steps; for example, steps 204, 206 and 208 may be combined such that the first fiber end is contacted with the port and then simultaneously heated using the laser.

While various embodiments of the present invention have been described in detail, it is apparent that further modifications and adaptations of the invention will occur to those skilled in the art. However, it is to be expressly understood that such modifications and adaptations are within the spirit and scope of the present invention.

What is claimed:

1. A method for connecting an optical fiber between optical ports comprising the steps of:

a) providing an optical fiber having an end portion;

b) heating the end portion of the optical fiber to soften the end portion;

c) contacting the softened end portion with a first optical port so as to create an optical connection between the optical fiber and the optical port for transfer of optical signals therebetween;

d) routing the optical fiber to a second optical port;

e) connecting the optical fiber to the second port f) relieving stresses within the optical fiber after attachment.

2. A method according to claim 1, wherein the optical fiber has a homogenous cross section.

3. A method according to claim 1, wherein optical fiber contains a core portion for transmitting optical signals and a cladding portion encasing the core portion for preventing light leakage from the core portion.

4. A method according to claim 1, wherein the first optical port is a light emitting port and is connected to a second light receiving port wherein the optical fiber transmits an optical signal from the first port to the second port.

5. A method according to claim 1, wherein at least one of the optical ports is a fiber optic cable.

6. A method according to claim 1, wherein at least one optical port is contained in an optoelectronic chip.

7. A method according to claim 1, wherein an initial optical device is connected to multiple optical ports using separate optical fibers.

8. A method according to claim 1, wherein an initial optical port is connected to multiple optical ports using a single fiber optic cable to create a bus connection between all the optical ports.

9. A method according to claim 1, wherein connecting the optical fiber to the second port further comprises the steps of:
   a) contacting the optical fiber to the second optical transmission port; and
   b) heating section of the optical fiber in contact with the optical transmission port so as to create an optical connection between the optical fiber and the optical port for transfer of optical signals therebetween.

10. A method according to claim 9, wherein the contacting step comprises using a mechanical pawl to press the optical fiber's longitudinal axis into contact with the second transmission port.

11. A method according to claim 10, wherein the pawl is shaped so as to create a neck in the fiber at the second port (more of an apparatus claim?).

12. A method according to claim 10, wherein the optical connection is shaped to allow photons to enter into an optical fiber's cladding and couple with the second optical transmission port.

13. A method according to claim 10, wherein the pawl is transparent to at least one laser wavelength.

* * * * *